United States Patent
Yang et al.

(10) Patent No.: US 6,365,527 B1
(45) Date of Patent: Apr. 2, 2002

(54) METHOD FOR DEPOSITING SILICON CARBIDE IN SEMICONDUCTOR DEVICES

(75) Inventors: Neng-Hui Yang; Ming-Sheng Yang, both of Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/684,498

(22) Filed: Oct. 6, 2000

(51) Int. Cl.[7] .................. H01L 21/31; H01L 21/469
(52) U.S. Cl. ............... 438/761; 438/931; 427/249.15; 427/577; 427/589
(58) Field of Search ............... 257/777; 427/249.15, 427/577, 589; 438/761, 931

(56) References Cited

U.S. PATENT DOCUMENTS

| | | | |
|---|---|---|---|
| 4,194,028 A | * | 3/1980 | Sirtl et al. .............. 427/249.16 |
| 5,116,462 A | * | 5/1992 | Bartha et al. ................... 216/2 |
| 6,136,680 A | * | 10/2000 | Lai et al. ..................... 438/597 |

OTHER PUBLICATIONS

Lai et al., Interface properties of $N_2O$-annealed $NH_3$-treated 6H-SIC MOS capacitor, Proc. 1999 Electron Devices Mtg., Jun. 1999, pp. 46–49.*

Afanas'ev, Electronic properties of $SiO_2/SiC$ interfaces, Microelectronics Engineering, 48 (1999) 241–248.*

Xu et al., Improved interface properties of p-type 6H-SiC/$SiO_2$ system by $NH_3$ pretreatment, App. Phys. Lett., 76 (2000) 372.*

Migitaka, Excellent silicon nitride films made by hybrid process and application to a-Si TFTs, Proc. Intern. Semiconductor Conf., Oct. 2000, pp. 23–32.*

Chung et al., Effects of anneals in ammonia on the interface trap density near the band edges in 4H-silicon carbide metal-oxide-semiconductor capacitors, App. Phys. Lett., 77 (2000) 3601.*

* cited by examiner

*Primary Examiner*—Richard Elms
*Assistant Examiner*—Christian D. Wilson

(57) ABSTRACT

A silicon carbide film is formed in a manner which avoids the high level contents of oxygen by depositing the film in at least two consecutive in-situ steps. Each step comprises plasma enhanced chemical vapor deposition (PECVD) of silicon carbide and ammonia plasma treatment to remove oxygen contained in the deposit silicon carbide. The disclosed method is found to enhance several insulation properties of the silicon carbide film and can be easily adapted into production-level IC processing.

13 Claims, 1 Drawing Sheet

METHOD FOR DEPOSITING SILICON CARBIDE IN SEMICONDUCTOR DEVICES

BACKGROUND OF THE INVENTION

1. Field of the Invention

The present invention relates to the disposition of silicon carbide on semiconductor devices, and more particularly, to a method for forming such silicon carbide deposit containing a minimum amount of oxygen.

2. Description of the Prior Art

Silicon carbide formed by plasma-enhanced chemical vapor deposition (PECVD), possessing a low dielectric constant and high resistivity, has become a potential substitute for silicon nitride in semiconductor IC (Integrated Circuits) fabrication. As device technology leads to smaller and smaller geometries, the development of the silicon carbide film is believed to be one solution for resolving possible RC delay phenomenon during IC fabrication.

A film of PECVD silicon carbide is typically deposited from gaseous organosilicon such as silane/methane, trimethylsilane or tertramethylsilane. The deposition may be carried out in a single step or in multiple steps. The PECVD film generally contains large amounts of bonded hydrogen in the form of Si—H and C—H, and the composition of which is thus represented as $SiC_xH_y$. PECVD carbide deposit is similar to a nitride film in the way that they are both impermeable to oxygen and water. Such film of appropriate thickness can be used as a mask to block oxidation of the substrate underneath and will oxidize very slowly at the surface. In addition, the carbide material is found to exhibit excellent insulating properties, such as low dielectric constant (in the range of 4–5) and high resistivity towards copper diffusion. As a result, a PECVD silicon carbide film is an excellent choice other than nitride for making insulators such as copper barrier or hardmask during IC fabrication.

However, the deposition of a typical PECVD silicon carbide film suffers from one major difficulty, that is, the purification of the carbide composition. The conventionally-formed silicon carbide is found to contain relatively high amounts of oxygen, typically in thousands of ppm level, which is more than ten times the typical oxygen content in a nitride deposit. Such a high content of oxygen atoms could constitute up to 3% (generally between 0.1–0.5%) of the deposited carbide composition and thus greatly restricts the applicability of the insulator. Taking copper barriers for example, the composed barrier material is expected to appropriately inhibit copper diffusion, yet an oxygen-rich substance such as the conventional PECVD silicon carbide would adversely enhance copper oxidation and thus largely increase resistance at the copper side. Similarly, application of the oxygen-rich material for a hardmask is unfavorable, especially for hardmasking low-k interlevel insulators. An oxygen-rich hardmask tends to enhance oxidation of the substrate underneath and results in an inexpedient increase in the dielectric constant of the substrate material.

Therefore, a need exists for a process which can effectively reduce the oxygen content of the silicon carbide deposit.

SUMMARY OF THE INVENTION

In accordance with the present invention, a method is provided to reduce the oxygen content of PECVD silicon carbide deposit. The invention modifies the conventional deposition process to be compatible with production-level IC processing. In accordance with an aspect of the present invention, even if the silicon carbide film is inevitably formed containing oxygen as impurities, the oxygen content is as low as that in a comparable silicon nitride layer.

In accordance with the present invention, the oxygen reduction is acheived by an additional plasma treatment following the film deposition step. The plasma treatment is performed in-situ with a PECVD silicon carbide process, therefore, no additional fabrication facilities are necessary to practice the present innovation as compared to prior art silicon carbide processes. More specifically, every oxygen removal treatment is performed within one PECVD reaction chamber (the one used for depositing silicon carbide) by introducing appropriate plasma of sufficient energy into the chamber. The plasma reacts with the film-containing oxygen and carries the reaction product away from the carbide deposit. Tests show that the additional use of such treatment can cut down the oxygen content by an order of a decimal. In addition, the disclosed method is found to improve breakdown voltage, leakage current and copper diffusion resistance of the silicon carbide deposit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DESCRIPTION OF THE PREFERRED EMBODIMENT

Figure 1:
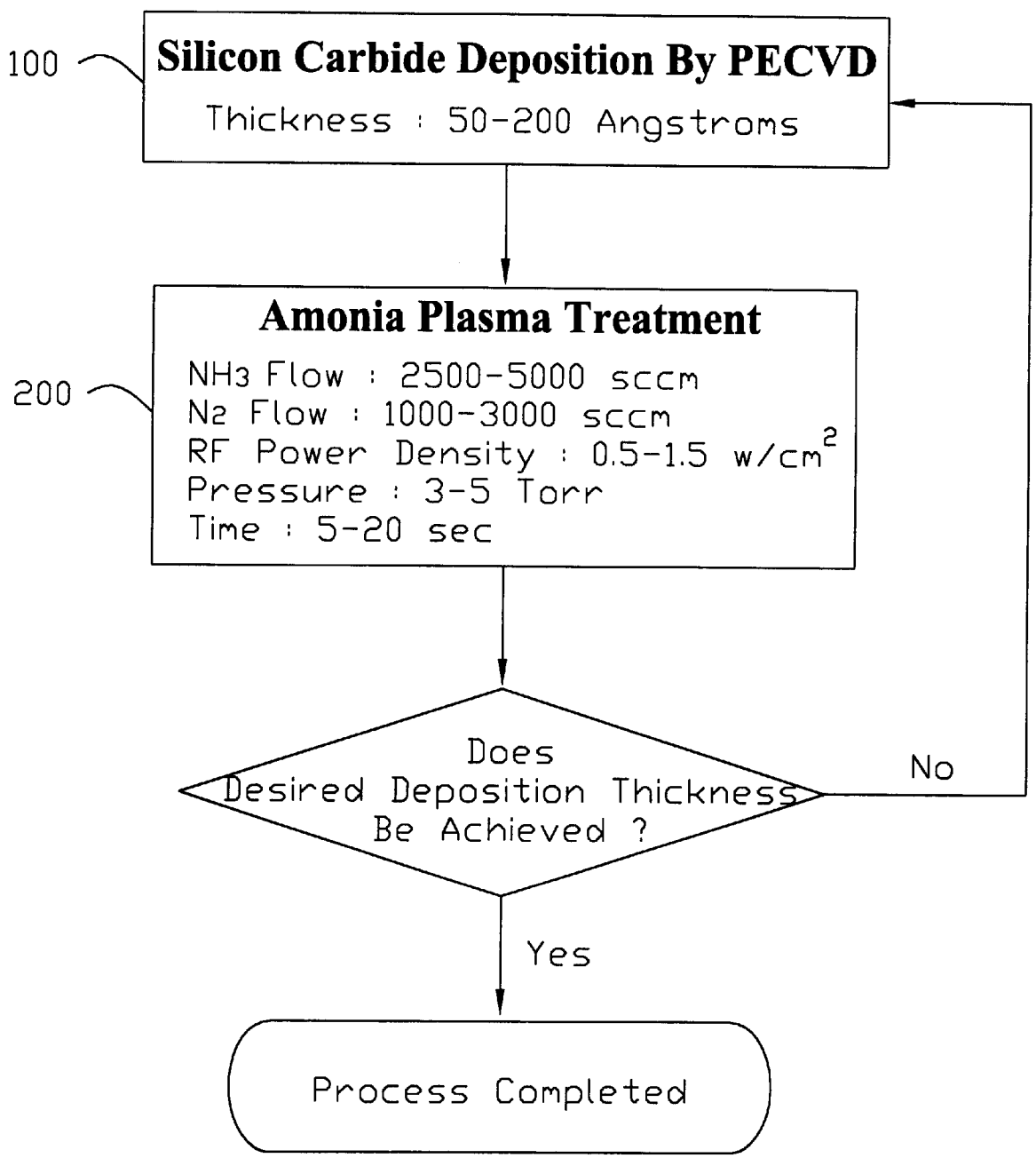
FIG. 1 is a flow chart demonstrating a process for forming a silicon carbide film in a semiconductor device in accordance with one embodiment of the present invention.

FIG. 1 illustrates a process flow for forming a silicon carbide film in a semiconductor device in accordance with one embodiment of the present invention. In block 100, a silicon carbide layer is deposited over a semiconductor substrate. The substrate may comprise active regions or active devices necessitated for forming an integrated circuit. The carbide layer may typically have a thickness in the range of 50 to 200 angstroms. The following process may be used: PECVD using silane/methane, bimethylsilane, trimethylsilane, tertramethylsilane or other organosilicon precursor gas and $N_2$, Ar or He as carrier gas.

Following the carbide deposition, the deposit is treated with an in-situ ammonia plasma, as illustrated in block 200. The ammonia plasma treatment comprises the following processing parameters; an ammonia gas flow in the range of 2500 to 5000 sccm; a nitrogen flow in the range of 1000 to 3000 sccm; a PF power density in the range of 0.5 to 1.5 W/cm2; and a chamber pressure ranging from 3 to 5 Torr; Depending on the carbide deposited thickess, the plasma treatment lasts generally from 5 to 20 seconds. During the plasma treatment, the H atoms dissociated from ammonia plasma tend to diffuse into the carbide film at a temperature higher than 400° C. and carry out the excess oxygen atoms from the carbide deposit in the form of H2O molecules. As such, the oxygen content of the silicon carbide material is effectively reduced.

The deposition process followed by plasma treatment (block 100 and 200) may be repeated until a desired film thickness has been achieved. The removal of the excess oxygen is accomplished by simply switching the chamber condition from film deposition to ammonia treatment. As a result, the disclosed method can be easily adapted into production-level IC processing.

To demonstrate the quality improvements of silicon carbide fabricated by the disclosed method, film formation is carried out in a Novellus PECVD reaction chamber. Tetramethylsilane is the major precursor gas for silicon carbide PECVD. The deposition is performed in six different steps and all the six steps are equipped with substantially the same process conditions. Each step deposits silicon carbide to a thickness of about 150 angstroms to build up a film of about 900 angstroms in total thickness. The six deposition steps will be done consecutively without process interruption for the formation of a prior art silicon carbide film. Otherwise, the film formed by the disclosed method is additionally treated with ammonia plasma after each deposition step for approximately 15 seconds. The process conditions for the ammonia plasma treatments are as follows: an ammonia gas flow of 3500 sccm, a nitrogen flow of 2000 sccm, a RF power density of 1 W/cm$^2$, and a chamber pressure of 3.5 Torr. Table I summarizes some properties of the carbides formed by the aforementioned conditions. A conventional PECVD nitride film with comparable film thickness is also listed for comparison.

TABLE I

| Film Type | Film Thickness (A) | Refractive Index | Oxygen Content (Atom %) |
|---|---|---|---|
| Silicon Nitride Prior Art | 910 | 2.013 | 0.013 |
| Silicon Carbide Prior Art | 905 | 1.852 | 0.23 |
| Silicon Carbide This Invention | 912 | 1.843 | 0.014 |

It is noted that with the additional plasma treatment of the carbide deposit, the level of oxygen content is effectively brought down (from 0.23% to 0.014%; the prior art oxygen content is about 15 times higher than the one formed by the present invention) to a comparable value as that in a PECVD nitride (0.013%). The relative amount of oxygen in the silicon carbide film affects the oxidation capability of the deposit. As a result, the PECVD carbide with oxygen content reduction becomes a suitable material for use in oxygen-sensitive process and turns out to be a favorable selection for certain insulators such as copper barriers or hardmasks of low-k dielectrics.

Further, the additional use of plasma treatment does not seem to affect the atomic arrangements of the carbide deposit or to degrade the electrical performance of the insulating film. The analysis of Secondary Ion Mass Spectrum (SIMS) indicates that, other than oxygen, the atomic distributions of the silicon carbide deposit remain substantially unchanged. Experimental values even show, in Table II, slight improvements on breakdown voltage, leakage current and copper diffusion resistance of the plasma-treated silicon carbide.

Although specific embodiments have been illustrated and described, it will be obvious to those skilled in the art that various modifications may be made without departing from what is intended to be limited solely by the appended claims. For example, the plasma treatments for oxygen reduction might be applicable to certain semiconductor materials other than silicon carbide. Moreover, different plasma sources with feasible conditions may achieve similar results for oxygen reduction as in the aforementioned embodiment. Further, the plasma treatment may not be necessary for each deposition step and can be applied on a feasible deposit thickness after several steps of deposition have been completed.

What is claimed is:

1. A method for forming a silicon carbide film, comprising:
   providing a semiconductor substrate; and
   depositing, by plasma enhanced chemical vapor deposition using an organosilicon precursor gas, at least two successive layers of silicon carbide on said semiconductor substrate, each layer being treated with in-situ ammonia plasma to remove contained oxygen of the deposited layer.

2. The method according to claim 1, wherein each of the at least two successive layers of silicon carbide has a thickness ranging from 50 to 200 angstroms.

3. The method according to claim 2, wherein the ammonia plasma treatment comprises the following processing parameters: an ammonia gas flow in the range of 2500 to 5000 sccm, a carrier gas flow in the range of 1000 to 3000 sccm, a RF power density in the range of 0.5 to 1.5 W/cm$^2$, and a chamber pressure ranging from 3 to 5 Torr.

4. The method according to claim 3, wherein said ammonia plasma treatment is performed for a period ranging from 5 to 20 seconds.

5. The method according to claim 1, wherein said organosilicon precursor gas is a gas chosen from the group consisting of silane/methane, dimethylsilane, trimethylsilane and tetramethylsilane.

6. The method according to claim 1, wherein said ammonia plasma treatment occurs at a temperature greater than 400° C.

7. The method according to claim 1, wherein said at least two successive layers of silicon carbide are used as a hardmask or an insulator.

8. A method of forming an electronic device, comprising:
   forming a copper member within a semiconductor device; and
   depositing, by plasma enhanced chemical vapor deposition using an organosilicon precursor gas, at least two successive layers of silicon carbide on said semiconductor substrate,
   each layer being treated with in-situ ammonia plasma to remove contained oxygen of the deposited layer,

TABLE II

| Film Type | Dielectric Constant | Breakdown Voltage At 500 A thickness (MV/cm) | Leakage Current At 1 MV/cm (A/cm2) | Copper Diffusion Resistivity (450 C, 3 Hr) |
|---|---|---|---|---|
| Prior Art Silicon Carbide | 4.42 | 3.5 | 9.50E-09 | 245 A |
| The Invention Silicon Carbide | 4.43 | 3.8 | 8.7E-09 | 230 A | whereby a silicon carbide multi-layered film capable of inhibiting copper diffusion is formed.

9. The method according to claim 8, wherein each of the at least two successive layers of silicon carbide has a thickness ranging from 50 to 200 angstroms.

10. The method according to claim 9, wherein the ammonia plasma treatment comprises the following processing parameters: an ammonia gas flow in the range of 2500 to 5000 sccm, a carrier gas flow in the range of 1000 to 3000 sccm, a RF power density in the range of 0.5 to 1.5 W/cm$^2$, and a chamber pressure ranging from 3 to 5 Torr.

11. The method according to claim 10, wherein said ammonia plasma treatment is performed for a period ranging from 5 to 20 seconds.

12. The method according to claim 8, wherein said organosilicon precursor gas is a gas chosen from the group consisting of silane/methane, dimethylsilane, trimethylsilane and tertramethylsilane.

13. The method according to claim 8, wherein said ammonia plasma treatment occurs at a temperature of about 400° C.

* * * * *

UNITED STATES PATENT AND TRADEMARK OFFICE
CERTIFICATE OF CORRECTION

PATENT NO. : 6,365,527 B1
DATED : April 2, 2002
INVENTOR(S) : Yang et al.

It is certified that error appears in the above-identified patent and that said Letters Patent is hereby corrected as shown below:

Title page,
Item [*] Notice, delete the phrase "by 0 days" and insert -- by 29 days --

Signed and Sealed this

Twenty-first Day of September, 2004

JON W. DUDAS
*Director of the United States Patent and Trademark Office*